United States Patent
Watanabe

(10) Patent No.: US 6,248,449 B1
(45) Date of Patent: Jun. 19, 2001

(54) FLEXIBLE PRINTED SUBSTRATE HAVING A CONDUCTIVE PATTERN FORMED THEREON

(75) Inventor: Yasushi Watanabe, Miyagi-ken (JP)

(73) Assignee: Alps Electric Co., LTD, Tokyo (JP)

( * ) Notice: Subject to any disclaimer, the term of this patent is extended or adjusted under 35 U.S.C. 154(b) by 0 days.

(21) Appl. No.: 09/456,697

(22) Filed: Dec. 9, 1999

(30) Foreign Application Priority Data

Dec. 10, 1998 (JP) .................................................. 10-350970

(51) Int. Cl.⁷ ........................................................ B32B 15/08
(52) U.S. Cl. ........................ 428/458; 428/209; 428/212; 428/901; 174/257; 252/514
(58) Field of Search ...................................... 428/209, 901, 428/212, 458, 539.5; 174/287, 258, 257; 252/514

(56) References Cited

U.S. PATENT DOCUMENTS

| | | | |
|---|---|---|---|
| 4,318,830 | * 3/1982 | Horowitz | 252/514 |
| 4,415,486 | * 11/1983 | Boonstra et al. | 428/432 |
| 4,416,932 | * 11/1983 | Nair | 428/209 |
| 4,939,022 | * 7/1990 | Palanisamy | 428/210 |
| 5,234,558 | * 8/1993 | Kadokura | 205/118 |
| 5,243,142 | * 9/1993 | Ishikawa et al. | 174/262 |
| 5,366,813 | * 11/1994 | Berlin | 428/546 |
| 5,422,190 | * 6/1995 | Alexander | 428/548 |
| 5,716,552 | 2/1998 | Paszkiet et al. | 252/514 |
| 5,922,245 | * 7/1999 | Mohri et al. | 252/514 |

FOREIGN PATENT DOCUMENTS 7-91453  10/1995  (JP) .

* cited by examiner

*Primary Examiner*—Cathy Lam
(74) *Attorney, Agent, or Firm*—Brinks Hofer Gilson & Lione

(57) ABSTRACT

A flexible printed substrate has a flexible substrate made of a resin insulating material such as polyester resin and a conductive pattern formed thereon. The conductive pattern is composed of conductive powders consisting of palladium-silver alloy powders and a binder made of an organic resin material such as phenol resin. The palladium-silver alloy powders comprises at least 30 wt. % but less than 100 wt. % of palladium and, as the remaining portion, silver. The conductive powders are a mixture of flaky alloy powders and spherical alloy powders, wherein the former is contained in an amount of at least 50 wt. % but not greater than 70 wt. % and the latter is contained as the remaining portion. Both migration and sulfidization of the conductive pattern thus formed are decreased with respect to conventional conductive patterns and inexpensive flexible printed substrates can be provided.

7 Claims, 3 Drawing Sheets

FLEXIBLE PRINTED SUBSTRATE HAVING A CONDUCTIVE PATTERN FORMED THEREON

BACKGROUND OF THE INVENTION

1. Field of the Invention

This invention relates to a flexible printed substrate having a conductive pattern formed thereon.

2. Description of the Related Art

It is the common practice to obtain a flexible printed substrate by forming a conductive pattern on a flexible substrate made of a polyester resin such as polyethylene terephthalate, a polyimide resin or the like. The conductive pattern is obtained by forming a paste-like material (conductor paste), which has been prepared by adding, to a mixture of conductive powders with a binder made of an organic resin material, a solvent or the like as needed, into a desired conductive pattern on the substrate by screen printing and then thermosetting it by maintaining it at a proper temperature for a predetermined time. Silver powders having low resistance have been employed frequently as the conductive powders.

Such a flexible printed substrate is sometimes used as a male contact portion of a connector by disposing a contact pattern at its end or as a fixed contact of a switching element of a flat keyboard or the like by disposing on a flexible printed substrate a pair of contact point patterns.

When a flexible printed substrate for which silver powders are used as conductive powders is placed under high-temperature and high-humidity conditions, the silver is ionized and tends to cause migration. Recently, due to a reduction in the size of devices, the flexible printed substrate itself becomes smaller and the distance between interconnections of a conductive pattern in turn becomes narrower. For example, the distance between contact patterns for a connector or the distance between contact point patterns for a switching element becomes as small as even about 0.3 mm, which is apt to cause a short circuits if water exists over plural interconnections and migration occurs. Migration tends to be accompanied by short circuits, particularly, in a pair of contact point patterns for a switching element, because of the potential difference between them. Another drawback is that since the conductor paste contains silver as a conductive powder, sulfidization tends to occur in the exposed portion, leading to a deterioration in the conductivity.

Means of forming a carbon layer so as to cover the surface of the conductive pattern with a so-called carbon paste, that is, a paste-like material obtained by mixing dust carbon with a binder is known as a technique for avoiding migration of the silver-made conductive pattern. Owing to carbon which is an element hard to ionize, neither migration nor a short circuit is induced even if water exists in the vicinity of the conductive pattern. In addition, the existence of the carbon layer prevents the sulfidization of the conductive pattern.

The above-described means of covering the surface of the silver conductive pattern with a carbon layer is however accompanied by the problem that when it is applied to the contact pattern of a connector or contact point pattern of a switching element, contact resistance increases, because access to the conductive pattern is through the carbon layer. In addition, it is difficult to form a carbon layer on the surface of the contact pattern of a connector or contact point pattern of a switching element because the distance between interconnections has decreased by such a large amount. Moreover, an increase in the number of manufacturing steps of a flexible printed substrate due to the addition of the carbon-layer-forming step increases the manufacturing cost.

Another technique for avoiding migration in a conductive pattern is described in Japanese Examined Patent Application Hei 7-91453, wherein palladium or the like is employed instead of silver as a conductive powder. This technique is based on the fact that the ionizing tendency of palladium is smaller than that of silver. Palladium is however far more expensive than silver and use of it inevitably increases the manufacturing costs of the conductor paste and the flexible printed substrate using it.

SUMMARY OF THE INVENTION

An object of the present invention is therefore to provide a flexible printed substrate having a conductive pattern formed from conductive powders which cause neither migration nor sulfidization easily and are inexpensive.

In a first aspect of the present invention for attaining the above-described object, there is thus provided a flexible printed substrate comprising a flexible substrate made of a resin insulating material and a conductive pattern formed thereon, said conductive pattern being composed of conductive powders made of silver-palladium alloy powders and a binder made of an organic resin material.

By using, as the conductive powders, alloy powders of silver having a low resistance and palladium which does not easily cause migration, occurrence of migration in the conductive pattern can be suppressed to the same level as that upon single use of palladium powders. In addition, a sulfidizing tendency which occurs upon single use of silver powders can be suppressed to the same level as that upon single use of palladium powders.

In a second aspect of the present invention for attaining the above-described object, there is also provided a flexible printed substrate, wherein the palladium content of the above-described alloy powders is not less than 30 wt. % but less than 100 wt. % and the remaining portion is silver. Compared with the single use of palladium powders as conductive powders, manufacturing cost can be reduced largely.

In a third aspect of the present invention for attaining the above-described object, there is also provided a flexible printed substrate, wherein the above-described conductive powders are a mixture of flaky alloy powders and spherical alloy powders and the content of the flaky alloy powders is not less than 50 wt. % but not greater than 70 wt. % and the remaining portion comprises the spherical alloy powders. According to this structure, the flat layers of the flaky powders (alloy powders) are stacked one after another, which makes it possible to secure the conductivity of the resulting conductive pattern in the planar direction and at the same time, the spherical alloy powders are interposed between the layers of the flaky alloy powders, which makes it possible to secure the conductivity of the conductive pattern in the thickness-wise direction.

In a fourth aspect of the present invention for attaining the above-described object, there is also provided a flexible printed substrate, wherein the above-described conductive pattern comprises not less than 30 vol. % but not greater than 40 vol. % of the above-described conductive powders and, as the remaining portion, the above-described binder. This structure makes it possible to keep a low specific resistance of the conductive pattern, thereby maintaining the conductivity, while increasing the hardness of the conductive pattern.

DETAILED DESCRIPTION OF THE PREFERRED EMBODIMENTS

Figure 1:
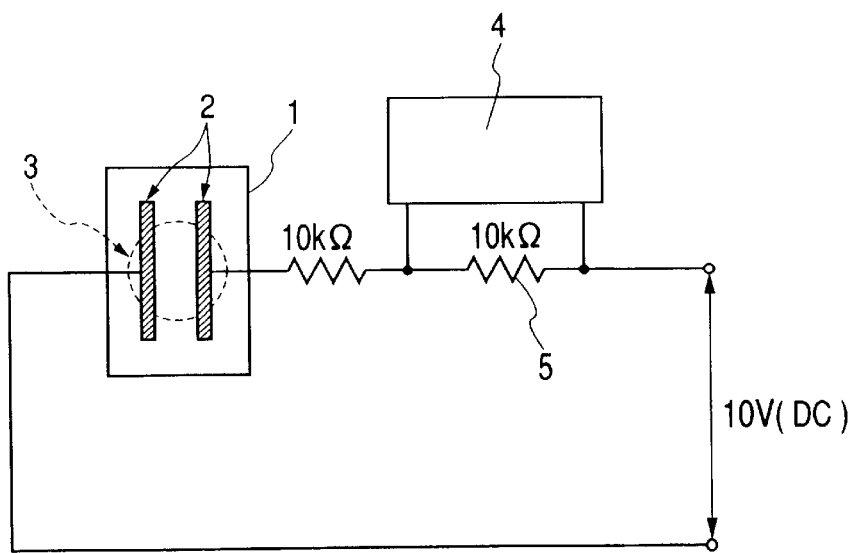
FIG. 1 is a diagram for describing the flexible printed substrate of the present invention, more specifically, a schematic view for illustrating a testing method of migration of the conductive pattern.
Figure 2:
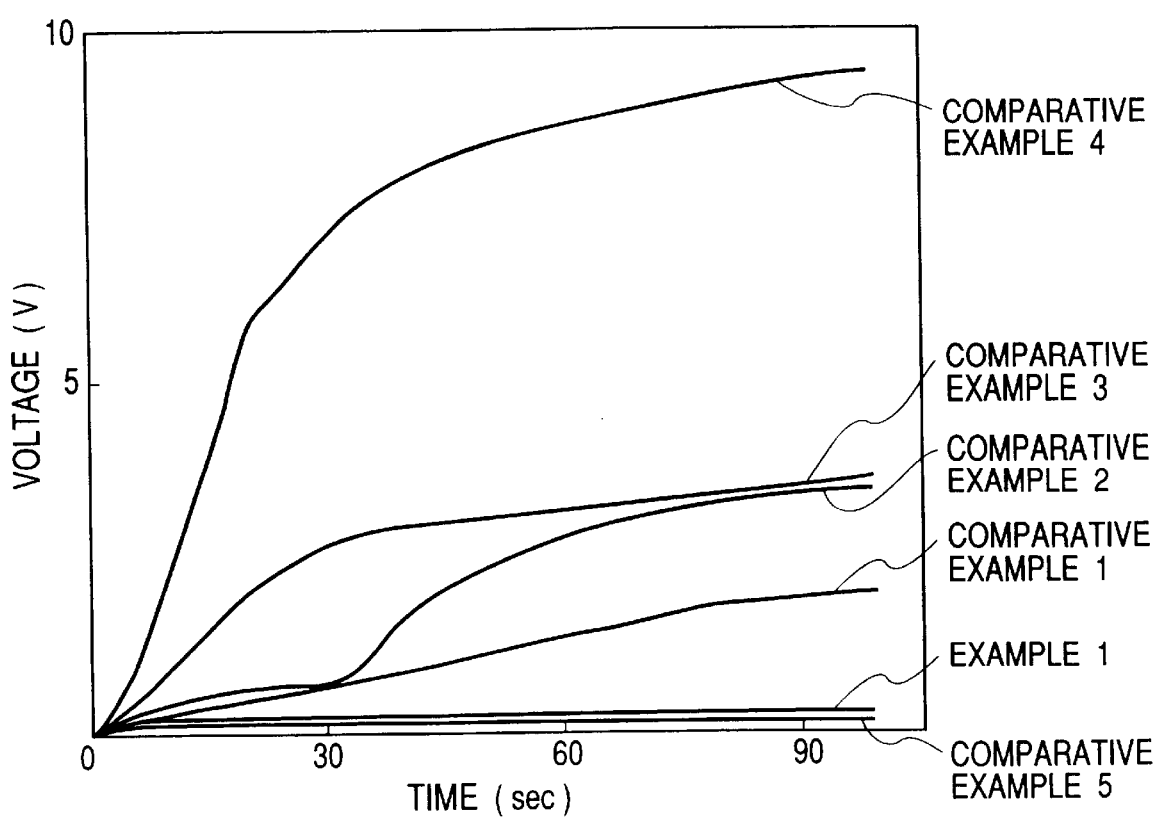
FIG. 2 is a diagram for describing the flexible printed substrate of the present invention, more specifically, a graph showing the testing results of migration of the conductive pattern.
Figure 3:
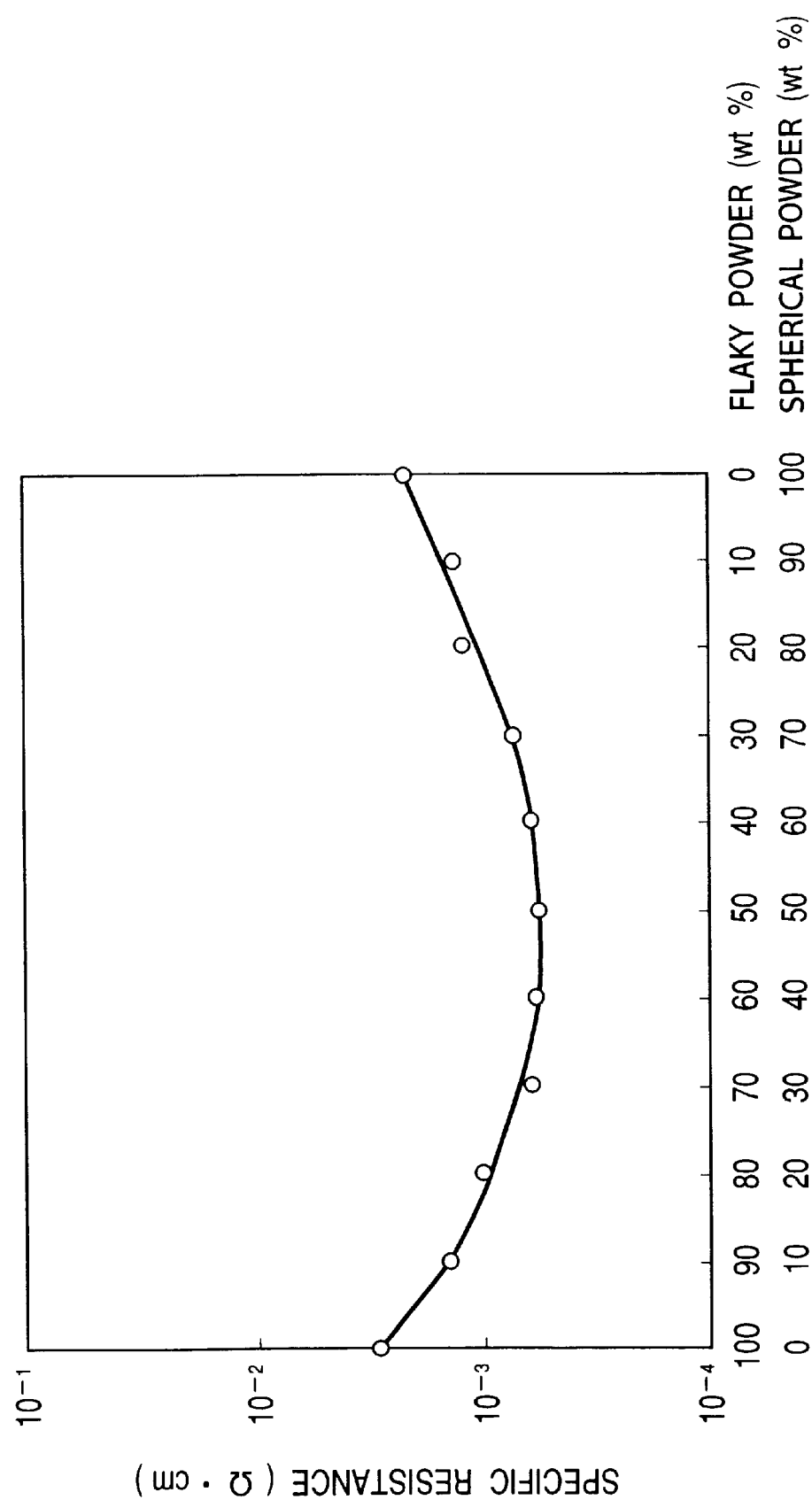
FIG. 3 is a diagram for describing the flexible printed substrate of the present invention, more specifically, a graph showing the relationship between the conductive powder which is a mixture of alloy powders different in shape and specific resistance.
Figure 4:
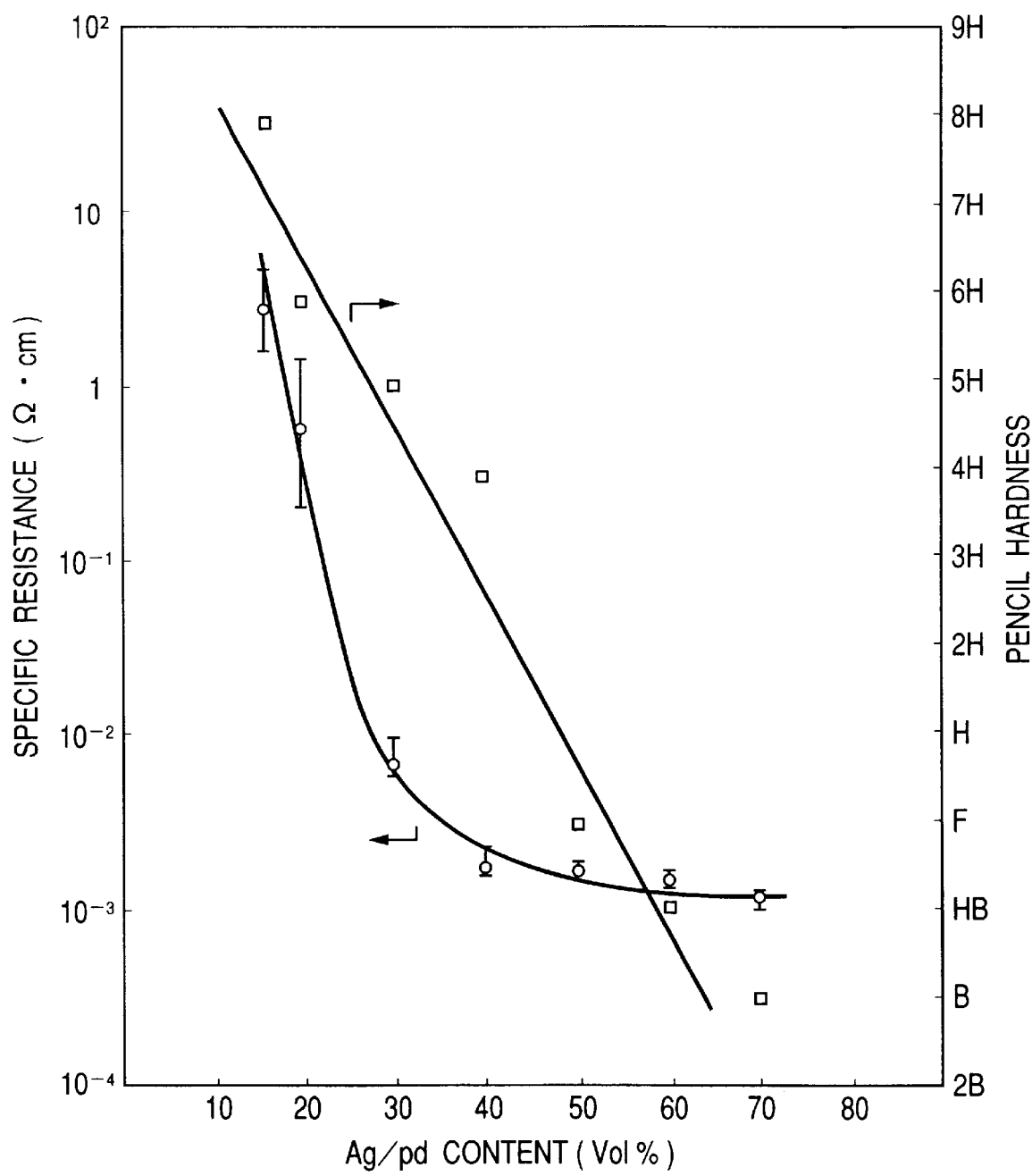
FIG. 4 is a diagram for describing the flexible printed substrate of the present invention, more specifically, a graph showing the relationship between the specific resistance of the conductive pattern obtained when the content of the binder relative to the conductive powder is varied as needed and pencil hardness.

A description will next be made of the embodiments of the flexible printed substrate of the present invention. FIG. 1 is a diagram illustrating the flexible printed substrate of the present invention, more specifically, a schematic view illustrating a testing method of migration of the conductive pattern; FIG. 2 is a graph showing the flexible printed substrate of the present invention, more specifically, a graph showing the testing results of migration of the conductive pattern; FIG. 3 is a diagram for describing the flexible printed substrate of the present invention, more specifically, a graph showing the relationship between the conductive powder which is a mixture of alloy powders different in shape and specific resistance; and FIG. 4 is a graph showing the flexible printed substrate of the present invention, more specifically, a graph showing the relationship between the specific resistance of the conductive pattern obtained when the content of the binder relative to the conductive powder is varied as needed and pencil hardness.

The flexible printed substrate of the present invention is obtained by forming a conductive pattern on a flexible substrate made of a polyester resin such as polyethylene terephthalate or a polyimide resin. The conductive pattern is obtained by forming, on the substrate, a conductor paste, which has been prepared by adding a solvent or the like as needed to a mixture of a conductive powder with a binder, into a desired shape by screen printing and thermosetting it by maintaining at a temperature of about 150° C. for 30 minutes.

In the present invention, a conductive powder composed of an alloy (silver-palladium alloy powder) of silver, which is relatively inexpensive and has a low resistance, with palladium which does not cause migration easily is employed as the conductor paste. As described above, owing to the small ionizing tendency of palladium, use of silver-palladium alloy powders can suppress migration similar to palladium powders alone. In addition, use of silver for alloy powders makes it possible to reduce the cost compared to palladium powders. Moreover, use of the alloy powders makes it possible to suppress sulfidization, as seen in silver powders by a similar amount as palladium powders.

The conductor paste is prepared by mixing and dispersing silver-palladium alloy powders, a binder composed of an organic resin material, a solvent and optionally another additive in a ball mill, a triple roll mill, a mixer (a stirrer), an automatic mortar (mixing and grinding machine), a planetary ball mill or the like.

For the flexible substrate made of an insulating resin, on which a conductive pattern is to be formed, an organic resin material having a thermosetting temperature as low as possible is employed as a binder. Examples include an acrylic resin, an urethane resin, a polyester resin, an alkyd resin, a vinyl acetate resin, a styrene resin and a vinyl chloride-vinyl acetate copolymer; a modified resin obtained by partially modifying any one of the above-exemplified resins with an epoxy group, a phenol group or the like; and a polycarbonate resin, an epoxy resin, a phenol resin, a melamine resin, a polyimide resin and a melamine alkyd resin and modified resins thereof. These resins can be used either singly or in combination. In addition, a silicone resin can also be used.

When the flexible printed substrate is employed as a male contact portion of a connector, it is preferred to use a resin having a high mechanical strength (hardness) after thermosetting, for example, a phenol resin in order to have resistance against the sliding movement of the conductive pattern at this portion.

Conventionally used solvents can be employed during processing. Examples include aromatic solvents such as toluene and xylene, ketones such as methyl ethyl ketone, methyl isobutyl ketone and acetaldehyde, esters such as butyl acetate, ethyl acetate and esters of a dibasic acid, cellosolves such as butyl cellosolve and ethyl cellosolve, alcohols such as ct-terpinenol, isopropanol and butanol, phenols such as phenol and chlorophenol, butyl carbitol and acetates such as butyl carbitol acetate. They can be used either singly or in combination.

When the content of palladium in the silver-palladium alloy powders is less than 30 wt. %, sufficient effects for suppressing migration are not available. Palladium powders are therefore added in an amount not less than 30 wt. %. If the conductive powder is composed solely of palladium (100 wt. %), a manufacturing cost cannot be reduced. The content of palladium is therefore adjusted to less than 100 wt. %.

A mixture of flaky powders and spherical powders is employed as the alloy powders, not merely alloy powders composed solely of spherical powders. The flaky alloy powders are prepared by beating a jig against spherical alloy powders, thereby crushing the powders. When a conductor paste composed of a mixture of spherical alloy powders and flaky alloy powders is formed into a conductive pattern by screen printing, the flat faces of the flaky alloy powders are stacked into layers, which makes it possible to maintain the conductivity of the conductive pattern in the planar direction and at the same time, the spherical alloy powders are interposed between the layers of the flaky alloy powders, which makes it possible to secure the conductivity in the thickness-wise direction of the conductive pattern and improve the conductivity as a whole.

When the content of the flaky alloy powders in the conductive powders is less than 50 wt. %, it is difficult to maintain the conductivity of the thus-formed conductive pattern in the planar direction. The content of the flaky alloy powders is therefore adjusted to 50 wt. % or greater. Contents exceeding 70 wt. %, on the other hand, deteriorate the consistency or thixotropy, which disturbs smooth formation of the conductive pattern by screen printing. Even if the conductive pattern is formed, it tends to peel off from the substrate. The content of the flaky alloy powders is therefore adjusted to 70 wt. % or less.

In addition, it is desired that in the mixture of the conductive powder and binder, the content of the conductive powder is not less than 30 vol. % but not greater than 40 vol. % and the remaining portion is the binder, which makes it possible to maintain the low specific resistance of the conductive pattern, thereby securing conductivity and at the same time, to increase the hardness of the conductive pattern.

EXAMPLES

The example of the flexible printed substrate according to the present invention will next be described. First, a manufacturing process of silver-palladium alloy powders to be used as a conductive powder is described. Silver and palladium were mixed at a desired weight ratio and after melting the resulting mixture at 1000° C., the resulting alloy was finely pulverized, whereby spherical alloy powders having an average diameter of 10 μm was obtained. A portion of the resulting silver-palladium alloy powders was charged in a mortar made of ceramics and then beaten by a pestle. By the impact, flaky alloy powders having an average diameter, at a flat portion, of about 20 μm and an average thickness of about 1 μm were obtained.

Relationship Between the Conductive Powders and Migration

For studying the migration properties of a conductive material by comparison, relationship between migration and each of conductor pastes different in the kind of the constituent conductive powders was found. Conductive powders employed were silver-palladium alloy powders, silver-palladium mixed powders, single substance of silver powders and single substance of palladium powders. Details are shown in Table 1. Each of the conductive powders employed were in the spherical form having an average diameter of about 10 μm.

TABLE 1

| Conductive powders tested | | Ag (wt. %) | Pd (wt. %) |
| --- | --- | --- | --- |
| Example 1 | Alloy powders | 70 | 30 |
| Comp. Ex. 1 | Alloy powders | 80 | 20 |
| Comp. Ex. 2 | Mixed powders | 70 | 30 |
| Comp. Ex. 3 | Mixed powders | 80 | 20 |
| Comp. Ex. 4 | Silver powders | 100 | — |
| Comp. Ex. 5 | Palladium powders | — | 100 |

A conductor paste was obtained by mixing and dispersing each of the above-described conductive powders (alloy powders or single substance), a phenol resin as a binder and butyl carbitol as a solvent in a ball mill. Upon mixing, the conductive powders and phenol resin were used at a volumetric ratio of 30 vol. %:70 vol. %. As illustrated in FIG. 1, the conductor paste thus obtained were formed into two parallel conductive patterns 2 (2 mm wide and 40 mm long) at an interval of 1 mm by screen printing (280 mesh) on a 75-μm thick substrate 1 made of polyethylene terephthalate (PET), followed by thermosetting at 150° C. for 1.5 hours. A circuit was connected so as to apply voltage to these two conductive patterns 2. After addition of distilled water 3 (about 0.1 ml of deionized water) to extend the water over both of these two conductive patterns 2, voltage of 10 V was applied and the voltage at either end of the resistor 5 was measured. The time-dependent change in this voltage was recorded by a pen recorder 4.

The conductive patterns 2 thus obtained each had a film thickness of about 50 μm and the specific resistance of about $8.0 \times 10^{-3} \Omega \cdot cm$.

As illustrated in FIG. 2, the voltage of the conductor pattern obtained in Example 1 was maintained at a low level and hardly showed change, indicating that migration did not occur even with the passage of time. The voltage of the conductive powders of Example 1 was substantially similar to that of Comparative Example 5 using palladium powders, which shows that the conductive powders of Example 1 bring about sufficient effects for preventing migration. It has been found that in Comparative Example 1, although an increase in the voltage was not so marked, it showed a gradual increase with the passage of time, indicating the beginning of migration. From these facts, it is presumed that the content of palladium relative to silver is preferably 30 wt. % or greater. In Comparative Example 2 or Comparative Example 3 wherein mixed powders were employed, or results of Comparative Example 4 wherein only silver powders were used, a large increase in the voltage was observed, indicating significant migration. This migration is presumed to be due to ionization of silver and transfer of the resulting silver ions. Thus, when mixed powders or single silver powders are employed, migration increases, indicating that the use of silver-palladium alloy powders is advantageous.

Relationship Between the Shape and Specific Resistance of Silver-palladium Alloy Powders In the next place, the relationship between each of mixtures of silver-palladium alloy powders different in shape, which were employed as conductive powders, and specific resistance was found. Flaky silver-palladium alloy powders and spherical silver-palladium alloy powders were mixed at varied mixing ratios and used as the conductive powders. The mixing ratio was as follows: the amount of the flaky alloy powders having an average diameter (length) of about 20 μm and an average thickness of about 1 μm was increased gradually by 10 wt. % within a range of from 0 to 100 wt. % and spherical alloy powders having an average diameter of about 10 μm were employed as the remaining portion. In other words, the flaky powders and the spherical powders were mixed at respective ratios of and used as the conductive powders. 100:0, 90:10, 80:20, . . . 20:80, 10:90 and 0:100 in terms of wt. %.

A conductor paste was obtained by mixing and dispersing the thus-mixed conductive powders, a phenol resin serving as a binder and butyl carbitol serving as a solvent in a ball mill. The conductive powders and phenol resin were mixed at a volumetric ratio of 40 vol. %:60 vol. %. On a 75-μm thick substrate made of polyethylene terephthalate (PET), the resulting conductor paste was formed into a conductive pattern of 2 mm wide and 100 mm long by screen printing (280 mesh), followed by thermosetting at 150° C. for 1.5 hours.

Upon formation of the conductive pattern by printing a conductor paste, contents of the flaky alloy powders in the conductor paste exceeding 70 wt. % (that is, at least 80 wt. %) did not bring about good printing results, while those not greater than 70 wt. % resulted in good. The conductive pattern available by the conductor paste containing at least 80 wt. % of flaky alloy powders tended to cause peeling of the coated film.

As a result of measuring the specific resistance of each of the conductive patterns, it has been found from FIG. 3 that when the contents of the flaky alloy powders and spherical alloy powders fall within the following ranges: 40 to 70 wt. % and the remaining portion (60 to 30 wt. %), respectively, the resulting conductive pattern has a low resistance and good conductivity.

Electron microscopic observation of the conductor paste thus obtained shows that the flat faces of flaky alloy powders are stacked into layers, which makes it possible to maintain conductivity of the conductive pattern in the planar direction and at the same time, spherical alloy powders are interposed between the layers of the flaky alloy powders, which makes it possible to maintain conductivity of the conductive pattern in the thickness-wise direction. It is presumed that if the content of the flaky conductive powders exceeds the above-described range, the intrastratum conductivity cannot be secured sufficiently because of the shortage in the spherical alloy powders. It is presumed, on the other hand, that if the content of the spherical alloy powders exceeds the above-described range, the conductivity of the conductive pattern in the planar direction cannot be secured.

Relationship Among the Content of a Binder, Specific Resistance and Hardness

In the next place, the relationship between the specific resistance and hardness of the conductive pattern at varied contents of the binder relative to the conductive powders was found. As the conductive powders, silver-palladium alloy powders containing Ag and Pd at a ratio of 70:30 (wt. %) were employed, while a phenol resin was used as the binder. A conductor paste was obtained by mixing and dispersing the conductive powders, a phenol resin as a binder and butyl carbitol as a solvent in a ball mill. The conductor paste contained the conductive powders and phenol resin at varied volumetric mixing ratios. On a 75-$\mu$m thick substrate made of polyethylene terephthalate (PET), each of the conductor pastes was formed into a conductive pattern of 2 mm wide and 100 mm long by screen printing (280 mesh), followed by thermosetting at 150° C. for 1.5 hours. Hardness was measured in accordance with pencil hardness test (JIS K5400).

As illustrated in FIG. 4, the hardness (illustrated by □) of the resulting conductive pattern showed a substantially linear change and rose with an increase in the volumetric mixing ratio of the binder. It has been found that an increase in the specific resistance (illustrated in ○) and a decrease in the conductivity were observed when the volumetric mixing ratio of the binder increases, that is, the volumetric mixing ratio of the conductive powders decreases. In particular, the increase in the specific resistance is drastic when the content of the conductive powders becomes not greater than 30 vol. %. From these facts, it is presumed that in order to impart proper hardness to the conductive pattern while maintaining its conductivity, the conductor paste is preferred to comprise not less than 30 vol. % but not greater than 40 vol. % of the conductive powders and, as the remaining portion, the binder.

According to the flexible printed substrate of the present invention which comprises a flexible substrate made of a resin insulating material and a conductive pattern formed thereon, said conductive pattern being composed of conductive powders made of silver-palladium alloy powders and a binder made of an organic resin material, occurrence of migration in the conductive pattern can be suppressed to the similar level to the single use of palladium powders. In addition, when only silver powders are used as the conductive powders, sulfidization tends to occur. The use of the alloy powders as the conductive powders however makes it possible to suppress such a sulfidizing tendency to the similar level to the single use of a palladium powders.

According to the flexible printed substrate of the present invention, wherein the palladium content of the alloy powders is not less than 30 wt. % but less than 100 wt. % and the remaining portion is silver, the manufacturing cost can be reduced compared with the single use of palladium powders as the conductive powders.

According to the flexible printed substrate of the present invention, wherein a mixture of flaky alloy powders and spherical alloy powders is used as the conductive powders; and the content of the flaky powders is not less than 50 wt. % but not greater than 70 wt. % and the remaining portion comprises the spherical powders, the faces of the flaky alloy powders are stacked into layers in the planar direction, which makes it possible to secure the conductivity of the conductive pattern in the planar direction and at the same time, the spherical alloy powders are interposed between the layers of the flaky alloy powders, which makes it possible to secure the conductivity of the conductive pattern in the thickness-wise direction.

According to the flexible printed substrate of the present invention, wherein said conductive pattern comprises not less than 30 vol. % but not greater than 40 vol. % of said conductive powders and, as the remaining portion, said binder, it is possible to maintain the specific resistance of the conductive pattern low, thereby securing the conductivity, while attaining high hardness of the conductive pattern.

According to the flexible printed substrate of the present invention which uses a phenol resin for the above-described binder and a polyester resin for the above-described substrate, mechanical strength of the conductive pattern can be heightened and a manufacturing cost can be reduced compared with the use of a polyimide resin, respectively.

What is claimed is:

1. A flexible printed substrate comprising a flexible substrate made of a resin insulating material and a conductive pattern formed thereon, said conductive pattern being formed of conductive powders composed of silver-palladium alloy powders, wherein said conductive powders are a mixture of flaky alloy powders and spherical alloy powders and the content of the flaky alloy powders is not less than 50 wt. % but not greater than 70 wt. % and the remaining portion comprises the spherical alloy powders, and a binder made of an organic resin material.

2. A flexible printed substrate according to claim 1, wherein the palladium content of said silver-palladium alloy powders is not less than 30 wt. % but less than 100 wt. % and the remaining portion comprises silver.

3. A flexible printed substrate according to claim 1, wherein said conductive pattern comprises not less than 30 vol. % but not greater than 40 vol. % of said conductive powders and, as the remaining portion, said binder.

4. A flexible printed substrate according to claim 1, wherein said flexible substrate is formed of a polyester resin and said binder is composed of a phenol resin.

5. A flexible printed substrate comprising a flexible substrate made of a resin insulating material and a conductive pattern formed thereon, said conductive pattern being formed of conductive powders composed of silver-palladium alloy powders and a binder made of an organic resin material, and wherein said conductive pattern comprises not less than 30 vol. % but not greater than 40 vol. % of said conductive powders and, as the remaining portion, said binder.

6. A flexible printed substrate according to claim 5, wherein the palladium content of said silver-palladium alloy powders is not less than 30 wt. % but less than 100 wt. % and the remaining portion comprises silver.

7. A flexible printed substrate according to claim 5, wherein said flexible substrate is formed of a polyester resin and said binder is composed of a phenol resin.

\* \* \* \* \*